United States Patent [19]

White et al.

[11] Patent Number: 4,902,533
[45] Date of Patent: Feb. 20, 1990

[54] METHOD FOR SELECTIVELY DEPOSITING TUNGSTEN ON A SUBSTRATE BY USING A SPIN-ON METAL OXIDE

[75] Inventors: Ted R. White; Jeff L. Klein, both of Austin, Tex.

[73] Assignee: Motorola, Inc., Schaumburg, Ill.

[21] Appl. No.: 63,891

[22] Filed: Jun. 19, 1987

[51] Int. Cl.⁴ .............................................. B05D 5/12
[52] U.S. Cl. .................................. 427/99; 427/255.1; 427/383.1; 437/228
[58] Field of Search ................... 427/99, 255.1, 383.3; 437/228

[56] References Cited

U.S. PATENT DOCUMENTS

| | | | |
|---|---|---|---|
| 3,785,862 | 1/1974 | Grill | 437/228 |
| 3,868,723 | 2/1975 | Lechaton | 357/68 |
| 4,289,574 | 9/1981 | Radigan | 437/228 |
| 4,343,676 | 8/1982 | Tarng | 437/228 |
| 4,400,865 | 8/1983 | Goth | 357/36 |
| 4,446,476 | 5/1984 | Isaac | 357/68 |
| 4,501,769 | 2/1985 | Hieber | 427/96 |
| 4,523,369 | 6/1985 | Nagakubo | 437/228 |
| 4,584,207 | 4/1986 | Wilson | 427/99 |

OTHER PUBLICATIONS

M. L. Green and R. A. Levy, "Structure of Selective Low Pressure Chemically Vapor—Deposited Films of Tungsten", J. Electrochem. Soc., vol. 132, No. 15, May 1985, pp. 1243-1250.

Primary Examiner—Shrive Beck
Assistant Examiner—Vi Duong Dang
Attorney, Agent, or Firm—Robert L. King

[57] ABSTRACT

A process for selectively depositing a metal such as tungsten on a substrate material is provided. In one form, a layer of insulating material such as silicon dioxide is formed on the substrate. A layer of either aluminum oxide or titanium oxide is then formed over the substrate by a spin-on technique. A straight-wall contact region to the substrate is formed and tungsten may then be quickly and selectively formed in the contact region only with chemical vapor deposition at a high pressure. In another form, the aluminum oxide or titanium oxide layer may be thickly formed directly above the substrate without the silicon dioxide layer being formed.

8 Claims, 1 Drawing Sheet 4,902,533

METHOD FOR SELECTIVELY DEPOSITING TUNGSTEN ON A SUBSTRATE BY USING A SPIN-ON METAL OXIDE

TECHNICAL FIELD

This invention relates generally to the manufacture of MOS integrated circuits, and more particularly concerns the selective deposition of tungsten by low pressure chemical vapor deposition (LPCVD).

BACKGROUND ART

Others have commonly deposited tungsten by selective chemical vapor deposition (CVD) to form metal contacts and vias on substrates. Desirable characteristics of tungsten for such applications are well documented in the literature. A common problem others have encountered is the lack of selectivity which exists when tungsten is deposited onto silicon and other materials. Deposition of tungsten on surfaces not desired to be metalized causes manufacturing delay and expense to remove the tungsten from the surface area wrongly metalized. Various methods have been proposed to overcome the stated problem. Typically, selective deposition of tungsten must be accomplished in a clean quartz system with no tungsten or other metal in the fabrication system. Such a clean system is expensive to obtain and maintain and significantly adds to manufacturing overhead. Other known methods and systems which selectively deposit tungsten on substrates are slow and not efficient for mass manufacturing of electronic circuits. Some of the known methods also do not selectively deposit tungsten in very thick layers unless a large amount of time is provided to do so. Some known methods to selectively deposit tungsten also require very specialized and expensive equipment to implement.

BRIEF DESCRIPTION OF THE INVENTION

Accordingly, an object of the present invention is to provide an improved method for selectively depositing tungsten on a surface by using a spin-on metal oxide.

Another object of this invention is to provide improved selectivity when depositing tungsten in a semiconductor process.

Yet another object of the present invention is to provide an improved method for providing straight wall contact/via metallization in an integrated circuit process.

A further object of the present invention is to provide an improved selective chemical vapor deposition of tungsten.

In carrying out the above and other objects of the present invention, there is provided, in one form, a substrate material. A layer of either aluminum oxide or titanium oxide is formed on the substrate by one of a variety of processes. In one form, an oxide layer is formed directly on the substrate and the aluminum oxide or titanium oxide is formed on the oxide layer. In either embodiment, a contact/via is formed with the substrate by removing the layer or layers above the substrate at a predetermined portion of the substrate. Tungsten is then deposited on an exposed portion of the substrate to a predetermined thickness by vapor deposition substantially without depositing the tungsten on a top surface of either the aluminum oxide or the titanium oxide.

These and other objects, features and advantages will be more clearly understood from the following detailed description taken in conjunction with the accompanying drawings.

DETAILED DESCRIPTION OF THE INVENTION

Figure 1A:
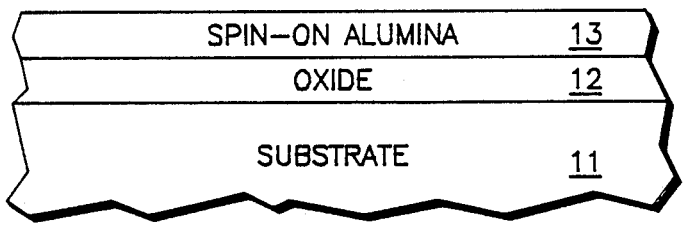
FIGS. 1(A) through 1(C) are schematic, cross-sectional illustrations showing the various stages of this invention as tungsten is deposited to make electrical contact with a substrate of an integrated circuit.

Shown in FIG. 1(A) is a cross-sectional view of the initial formation of a metal contact/via in an integrated circuit process in accordance with the present invention. Initially, a substrate 11 is formed having a substantially planar and horizontal top surface. An insulator such as oxide 12 is formed on the top surface of substrate 11. Any of a variety of insulating materials such as silicon dioxide, phosphosilicate glass (PSG), undoped low temperature oxide (LTO), spin-on glass, polyimide or borophosilicate glass (BPSG) may be used as oxide 12. The thickness of oxide 12 may vary depending upon the circuit application and may vary from approximately four hundred angstroms to up to four microns thick. A layer of alumina 13 is formed on the oxide 12. The alumina 13 may be represented by $Al_xO_y$ where "x" and "y" are real values. Alumina 13 may be formed on oxide 12 by a variety of techniques including a spin-on technique wherein the oxide 12 surface is spun while an aluminum oxide in liquid form is allowed to contact oxide 12. In one embodiment, the formation of the alumina 13 on oxide 12 results from the alumina 13 being spun onto the oxide 12 surface in a substantially uniform manner. Another technique in which alumina 13 may be formed on oxide 12 is by CVD or physical vapor deposition (PVD). In a chemical vapor deposition process, alumina 13 may be formed on oxide 12 by mixing a reactive gas, such as trimethyl aluminum, with oxygen in an evacuated chamber. The two gases react spontaneously to form alumina which deposits on the oxide 12. In a physical vapor deposition process, a target of alumina material is selected and bombarded with ions. The ions knock alumina off the target area and the alumina particles diffuse to the oxide 12 layer in a high vacuum environment. Other CVD techniques may also be used to form alumina 13 layer. In one form, $Al_2O_3$ may be used as alumina 13 although other values may be used for X and Y. The spin-on aluminimum oxide layer is then annealed for a short period of time at an elevated temperature. It should be noted that an alternative embodiment of the present invention would be to use only a thick alumina layer and not have insulating oxide 12 layer. In the alternative embodiment, the alumina would function as an insulating material over substrate 11. The following process steps described below are identical regardless of which embodiment is used.

Figure 1B:
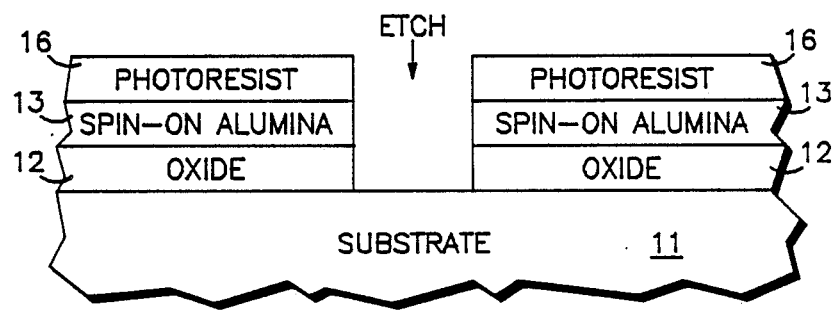

Shown in FIG. 1(B) is a cross-sectional view of the intermediate formation of a metal contact in the integrated circuit process of the present invention. A commerically available photoresist material 16 is placed over the alumina 13 prior to an etching process. The photoresist material 16 is removed from areas of the alumina which are desired to be etched away thus allowing contacts/vias to be patterned. In one form, the photoresist material 16 may be placed on the alumina 13 by the same type of spin-on technique used to form the alumina 13 on oxide 12. A standard photolithographic process is used to form the metal contact wherein photoresist material 16 is annealed, exposed and photographically developed before an etch step is implemented. Depending upon anneal conditions, the spin-on metal oxide layer may be patterned simultaneously with the photoresist material 16 during development. A commerically available etchant is then used to etch away alumina 13 and oxide 12 to substrate 11. The photoresist material 16 layer may be readily removed so that the alumina 13 surface is the top surface of the semiconductor in areas where substrate 11 is not exposed. The result is a straight wall contact/via region is formed to substrate 11 as shown in FIG. 1(B). The next step in the integrated circuit process is then to make a solid metal contact with substrate 11 in the integrated circuit device.

Figure 1C:
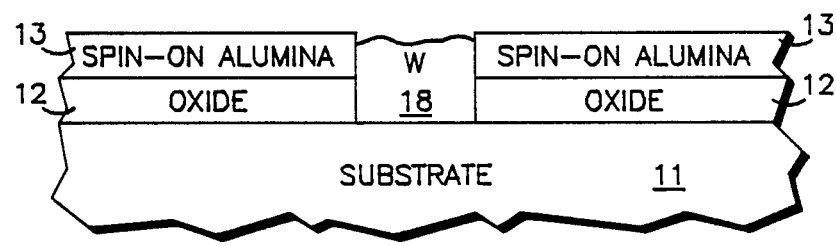

Shown in FIG. 1(C) is a cross sectional view of the final formation of a metal contact in the integrated circuit process of the present invention. A tungsten contact 18 is deposited on the exposed area of substrate 11 by CVD techniques. In accordance with a conventional CVD technique, tungsten (W) is deposited on the surface areas by placing the substrate 11 and associated semiconductor structure in a CVD reactor and heating the substrate. Tungsten hexafloride (WF$_6$), a reducing gas such as hydrogen (H$_2$), and an inert carrier gas such as argon (Ar) are then fed into the reactor. The tungsten hexafloride will react with the silicon in accordance with the following:

$$2WF_6 + 3Si \rightarrow 2W \downarrow + 3SiF_4 \uparrow . \quad (1)$$

The deposition of tungsten by this reaction is self-limiting and will stop after a layer of from one hundred to five hundred angstroms. Tungsten hexafluoride reacts with hydrogen to deposit additional tungsten in accordance with the following equation:

$$WF_6 + 3H_2 \rightarrow W \downarrow + 6HF \uparrow . \quad (2)$$

In the illustrated form of FIG. 1(C), because of the high local partial pressures of WF$_6$ and HF which exists in connection with the reaction of equation two, tungsten is observed to also associate with nucleation cites and deposit and form along the side walls of contact 18 on the side surfaces of oxide 12 and alumina 13 simultaneous with forming on substrate 11. As a result, the metalization of contact 18 is accomplished faster than if deposition only occurred on the tungsten in the contact fill area.

An advantage provided by the present invention is associated with the pressure under which the selectivity of tungsten deposition is maintained. In general, the greater the partial pressure of WF$_6$ is, the faster and more efficient the deposition rate of tungsten may be. In previous CVD processes which utilized these known chemical reactions, the partial pressure of WF$_6$ in the reaction chamber was typically required to be in the range of less than thirty milliTorr to keep tungsten from being deposited on surfaces other than the contact fill area. However, in the present invention the above described chemical reactions may be implemented in a high pressure chamber at a partial pressure of three hundred milliTorr and still maintain excellent tungsten deposition selectivity. One reason for the ability to deposit tungsten at an increased pressure is the excellent selectivity of tungsten deposition provided by the alumina surface. An aluminum oxide surface is found to effectively inhibit tungsten deposition associated with the reactions of equations one and two. The process steps of the present invention may be implemented over a wide temperature range including temperatures as low as three hundred degrees Centigrade. Further, the tungsten deposition process of the present invention may be implemented in a CVD process that does not have to be an extremely clean chamber surface environment.

Another advantage of the present invention over other known tungsten deposition techniques is the fact that if stray tungsten nuclei do attach to the alumina 13 surface, the tungsten may be easily removed. In the present invention, a lift-off technique may be used to quickly remove the tungsten nuclei from the alumina surface. When exposed to a basic solution, the alumina 13 surface quickly dissolves removing the tungsten nucleation sites as well.

Another material which may used in place of aluminum oxide which also provides similar results is titanium oxide, TiO$_X$ where "X" is a real value. If a titanium oxide is used in place of an aluminum oxide layer 13, the process steps described above are essentially the same. The titanium oxide may be applied either on substrate 11 in place of alumina 13 layer or on top of field oxide 12. When the titanium oxide is applied directly to substrate 11, a thick layer is applied as in the case previously mentioned for alumina so that the titanium oxide serves as an insulator. Titanium oxide has also been found to prevent nucleation cites for tungsten in the processes mentioned above. It should further be appreciated that the process described herein is applicable for the selective deposition of other metals on a substrate material in addition to tungsten. Further, other metal oxides may be used in conjunction with the present invention in place of an aluminum oxide layer to effectively inhibit tungsten nucleation in the selective deposition of a metal on a substrate surface.

By now it should be apparent that a selective tungsten deposition method has been provided which greatly improves the speed of deposition by providing a high pressure environment and which permits wide processing parameters which reduces manufacturing costs. Conventional semiconductor processing equipment may be used in connection with the present invention to deposit very selective thick tungsten films. Both via metal deposition fill and contact metal deposition fill may be accomplished in production quantities with the technique described herein.

While an embodiment has been disclosed using certain assumed parameters, it should be understood that certain obvious modifications to the process described herein or the given parameters will become apparent to those skilled in the art, and the scope of the invention should be limited only by the scope of the claims appended hereto.

We claim:

1. A method for selectively depositing tungsten on a semiconductor substrate during formation of an electronic device, comprising the sequential steps of:
   providing a substrate material;
   forming a layer either of aluminum oxide or titanium oxide above the substrate material;
   forming a contact/via area with the substrate material by removing the layer of either aluminum oxide or titanium oxide in a predetermined area above the substrate material and elsewhere maintaining either the aluminum oxide or titanium oxide exposed at a top surface of the device;

placing the device in a chemical vapor deposition reactor and heating the substrate to a predetermined temperature;

coupling tungsten hexafloride, a predetermined reducing gas, and a predetermined inert carrier gas into the reactor; and selectively depositing tungsten on the substrate material to a predetermined thickness by vapor deposition substantially without depositing the tungsten either on the aluminum oxide or titanium oxide at the top surface of the device..

2. The method of claim 1 further comprising the step of:

forming a layer of insulating material directly on the substrate material before forming the layer of either aluminum oxide or titanium oxide above the silicon substrate.

3. The method of claim 1 wherein tungsten is selectively deposited by vapor deposition at a partial pressure of $WF_6$ substantially in the range of five to five hundred milliTorr.

4. The method of claim 2 wherein the insulating material is one of either borophosphosilicate glass, phosphosilicate glass or an undoped low temperature oxide.

5. The method of claim 1 wherein the contact/via area is formed by a selective photolithographic etching of the layer of either aluminum oxide or titanium oxide.

6. The method of claim 1 wherein the tungsten hexafloride has a partial pressure of substantially three hundred milliTorr in the reactor.

7. A process for selectively forming a metal on a substrate surface via chemical vapor deposition (CVD) during formation of an electronic device, comprising the sequential steps of:

providing a substrate material;

forming an insulating material on a top surface of the substrate material;

forming a layer of aluminum oxide on a top surface of the insulating material;

forming a contact/via area with the substrate material by removing the insulating material and aluminum oxide layer above a predetermined portion of the substrate material and maintaining the aluminum oxide exposed on a top surface of the device;

placing the device in a chemical vapor deposition reactor and heating the substrate to a predetermined temperature;

coupling tungsten hexafloride, a predetermined reducing gas, and a predetermined inert carrier gas into the reactor; and selectively depositing the metal on the substrate material to a predetermined thickness by vapor deposition substantially without depositing the metal on a top surface of the aluminum oxide layer.

8. The process of claim 7 wherein the contact/via area which is formed is substantially a straight wall contact/via.

* * * * *